United States Patent [19]

Hattori

[11] Patent Number: 4,816,894
[45] Date of Patent: Mar. 28, 1989

[54] SEMICONDUCTOR VARIABLE CAPACITANCE ELEMENT

[75] Inventor: Yoshio Hattori, Tokyo, Japan

[73] Assignee: Seiko Instruments & Electronics Ltd., Tokyo, Japan

[21] Appl. No.: 8,290

[22] Filed: Jan. 29, 1987

[51] Int. Cl.$^4$ .................... H01L 29/78; H01L 27/22; H03K 19/094

[52] U.S. Cl. .................... 357/51; 357/23.5; 357/23.6; 357/14; 307/450; 307/468

[58] Field of Search ............... 357/14, 51, 23.6, 23.5; 307/450, 468

[56] References Cited

U.S. PATENT DOCUMENTS

| 3,512,052 | 5/1970 | Macluer et al. | 357/14 |
| 3,611,070 | 10/1971 | Engeler | 357/14 |
| 3,890,631 | 6/1975 | Tiemann | 357/14 |
| 3,890,635 | 6/1975 | Engeler | 357/14 |
| 4,021,788 | 5/1977 | Mark | 357/51 |
| 4,097,829 | 6/1978 | Cohen | 334/15 |
| 4,529,994 | 7/1985 | Sakai | 357/51 |
| 4,630,082 | 12/1986 | Sakai | 357/14 |

FOREIGN PATENT DOCUMENTS

| 52-75211 | 6/1977 | Japan | 307/450 |
| 53-09486 | 1/1978 | Japan | 357/14 |
| 0147169 | 8/1985 | Japan | 357/14 |
| 60-201724 | 12/1985 | Japan | 307/450 |

Primary Examiner—Andrew J. James
Assistant Examiner—Donald J. Featherstone
Attorney, Agent, or Firm—Bruce L. Adams; Van C. Wilks

[57] ABSTRACT

A variable capacitive element is comprised of a semiconductor substrate having a major surface and a capacitive region under the major surface of the semiconductor substrate, a floating electrode disposed on and electrically insulated from the semiconductor substrate through an insulating film for storing electric charge to build up an electric potential in the floating electrode according to the stored amount of electric charge to thereby determine an amount of capacitance of the capacitive region, and a control electrode for injecting electric charge into the floating electrode. A terminal electrode is electrically connected to the capacitive region for electrically connecting the capacitive region to an external circuit. The terminal electrode is capacitively coupled to the floating electrode. A given voltage is applied to the terminal electrode to adjust the electric potential of the floating electrode through the capacitive coupling between the terminal electrode and floating electrode. A capacitor is electrically connected between the terminal electrode and the external circuit for blocking an application of a DC voltage from the external circuit to the terminal electrode.

13 Claims, 3 Drawing Sheets

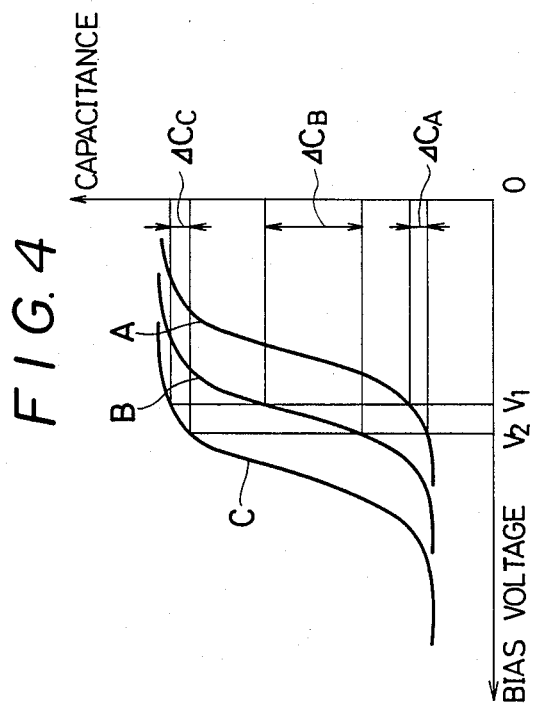
F I G. 4
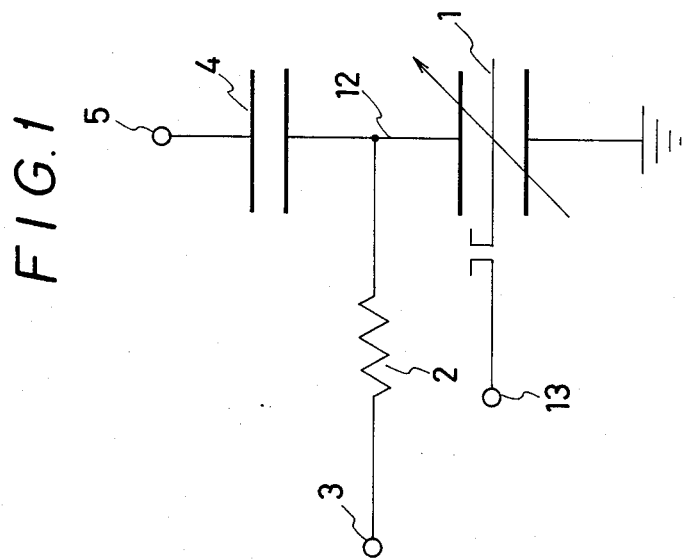
F I G. 1

SEMICONDUCTOR VARIABLE CAPACITANCE ELEMENT

BACKGROUND OF THE INVENTION

The present invention relates to a semiconductor variable capacitance element whose capacitance is controlled by an electric charge accumulated on a floating electrode which is covered with an insulator film provided in the surface of a semiconductor substrate so that the floating electrode is insulated from the outside.

Semiconductor variable capacitance elements have heretofore been described in the literature (see Proceedings vol. 2 in 11th International Congress of Chronometry, '84, edited by The French Society of Microtechnology and Chronometry, p.9).

FIG. 2 is a sectional view showing the structure of a conventional semiconductor variable capacitance element. On the surface of a semiconductor substrate 21 are provided a capacitance or terminal electrode 12 connected to an n-type diffused region 22, a floating electrode 23 having opposed major surface covered with an insulator film 25 so as to be insulated from the outside, and a variable or control electrode 13 for adjusting the amount of electric charge accumulated in the floating electrode 23.

In this semiconductor variable capacitance element, a depletion layer or capacitive region 24 formed in a surface region of the semiconductor substrate 21 which is located under the floating electrode 23 is controlled by a potential generated at the floating electrode 23 by the electric charge accumulated in the floating electrode 23. Since the floating and capacitance electrodes 23 and 12 are strongly capacitance-coupled to each other, the potential of the floating electrode 23 is varied in accordance with the voltage applied to the capacitance electrode 12.

Since the capacitance electrode 12 of the conventional semiconductor variable capacitance element is connected directly to an external circuit, a bias voltage which is generated in the external circuit is applied directly to the capacitance electrode 12. For this reason, any variation in the voltage applied from the external circuit causes a change in the bias voltage, and this leads to variations in capacitance of the variable capacitance element. When the voltage applied from the external circuit is relatively high, a relatively high voltage is applied between the capacitance and floating electrodes 12 and 23, thus causing a minute tunnel current to flow into the floating electrode 23 through the insulator film 25. In consequence, the amount of electric charge accumulated on the floating electrode 23 is changed, and the capacitance value of the variable capacitance element is also gradually changed with time, disadvantageously.

SUMMARY OF THE INVENTION

It is an object of the present invention to provide a semiconductor variable capacitance element wherein a bias means for applying a predetermined bias voltage to a capacitance electrode is provided, and a bias cut-off capacitance is connected in series to the capacitance electrode, whereby a bias voltage which is generated in an external circuit connected to the capacitance terminal is blocked and prevented from being applied to the capacitance electrode.

BRIEF DESCRIPTION OF THE DRAWINGS

FIG. 1 shows the circuit configuration of the semiconductor variable capacitance element according to the present invention;

FIG. 4 is a bias-voltage-capacitance characteristic chart showing the relationship between the capacitance value of the semiconductor variable capacitance element according to the present invention and the bias voltage applied to the bias terminal.

DETAILED DESCRIPTION OF PREFERRED EMBODIMENTS

One embodiment of the present invention will be described hereinunder in detail.

Figure 2:
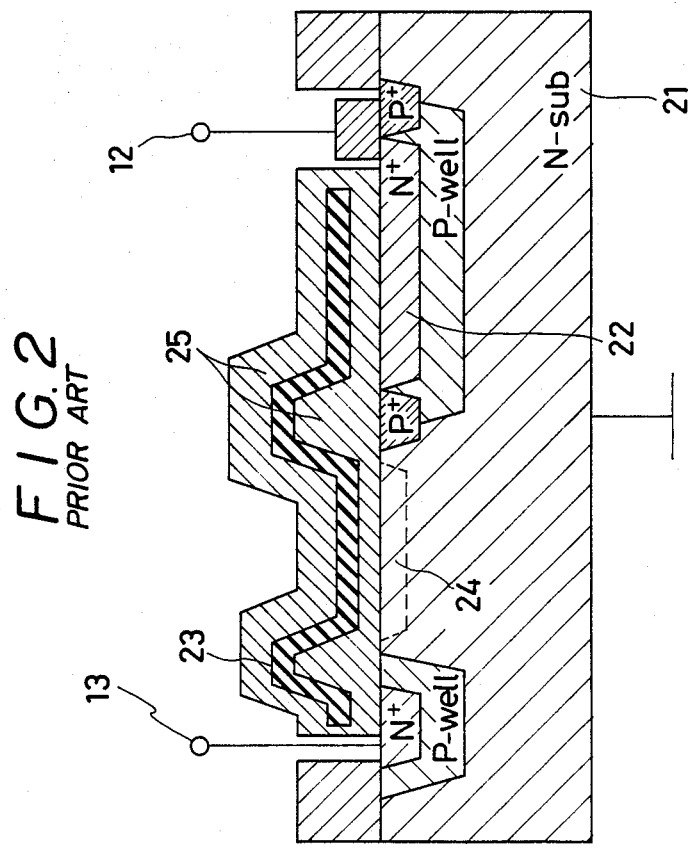
FIG. 2 is a sectional view showing the fundamental structure of a conventional semiconductor variable capacitance element.
Figure 3:
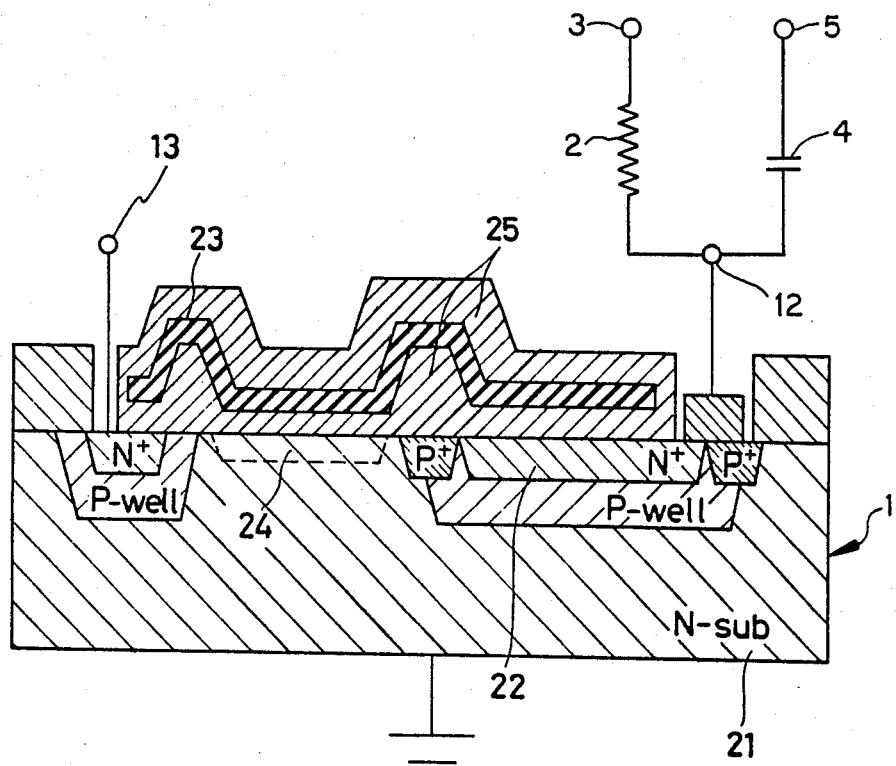
FIG. 3 is a sectional view showing the structure of the semiconductor variable capacitance element of the circuit configuration shown in FIG. 1.

FIG. 1 shows the circuit configuration of one embodiment of the present invention and FIG. 3 shows the structure thereof. For ease of description, the same reference numerals are used in FIGS. 2 and 3 to denote the same structure. The main body 1 of a semiconductor variable capacitance element has a capacitance or terminal electrode 12. A bias terminal 3 of bias means for externally applying a bias voltage is connected to the electrode 12 through an RF cut-off resistor 2 (or coil). Further, one electrode of a bias cut-off capacitor 4 is connected to the capacitance electrode 12, and the other electrode of the capacitor 4 is connected to an external circuit through a capacitance terminal 5.

A variable or control electrode 13 controls the amount of electric charge accumulated on the above-described floating electrode 23 of the semiconductor variable capacitance element 1. When a relatively high positive or negative voltage is applied to the variable electrode 13, a tunnel current flows through an extremely thin oxide film disposed between the floating electrode 23 and the variable electrode 13 within the semiconductor variable capacitance element, thus enabling the amount of electric charge accumulated in the floating electrode 23 to be changed. A change in potential generated by the electric charge accumulated in the floating electrode 23 causes a change of capacitance in the depletion layer 24 or capacitive region generated in the surface region of the above-described substrate. Since the floating electrode 23 is covered with an oxide film having excellent insulating properties, the electric charge accumulated is not changed with time unless a variable voltage pulse is applied to the variable terminal 13. In consequence, the semiconductor variable capacitance element 1 enables the electrostatic capacitance formed between the substrate and the capacitance electrode 12, 22 to be varied as desired by changing the amount of electric charge accumulated on the floating electrode 23.

Since the floating electrode 23 and the capacitance electrode 12 are strongly capacitance-coupled to each other, the potential of the floating electrode 23 is greatly affected by the voltage applied to the capacitance electrode 12.

In this embodiment, even when the supply voltage of an external circuit connected to the capacitance terminal 5 is relatively high and therefore a relatively high DC voltage is applied to the terminal 5, the voltage applied to the capacitance electrode 12 is blocked or cut off by the bias-cut-off capacitor 4. Accordingly, if a constant and relatively low bias voltage is applied to the bias terminal 3, the voltage applied to the terminal 3 alone is applied to the capacitance electrode 12. If the bias voltage applied to the bias terminal 3 is minimized, no high voltage is applied between the floating and capacitance electrodes 23 and 12, so that there is no change with time in the amount of electric charge accumulated on the floating electrode 23.

On the other hand, an AC component applied to the capacitance terminal 5 from an external circuit is cut off by the RF cut-off resistor 2 (or an RF cut-off coil may be employed). Accordingly, it will be understood that the capacitance value of the element 1 is constant as viewed from the capacitance terminal 5 and not affected by the bias terminal 3.

It will also be understood that, since a change in potential of the floating electrode 23 causes a change in capacitance of the element 1, it is possible to vary the capacitance value of the element 1 by changing the voltage applied to the bias terminal 3. When the voltage applied to the bias terminal 3 is changed, the voltage applied to the capacitance electrode 12 is changed, and since the potential of the floating electrode 23 changes in accordance with the voltage applied to the capacitance electrode 12, the capacitance value can be varied.

FIG. 4 is a bias voltage-capacitance characteristic chart showing the relationship between the capacitance value of the semiconductor variable capacitance element in accordance with this embodiment and the bias voltage applied to the above-described bias terminal 3. The axis of abscissas represents the bias voltage applied to the bias terminal 3, and the axis of ordinates represents the capacitance value. The curve A represents initial characteristics. Since the amount of electric charge accumulated in the floating electrode 23 is changed by applying a variable voltage pulse to the variable electrode 13, the characteristic curve A can be moved parallel as shown by the curve B or C. In other words, it is possible to obtain various curves such as those which are represented by B and C by accordingly changing the amount of electric charge. Since the floating electrode 23 is covered with an oxide film having excellent insulating properties, the electric charge accumulated shows no change with time for a long period of time, i.e., ten years or more. Accordingly, there is no change in characteristics represented by, for example, the curve A, B or C unless a variable voltage pulse is applied to the variable electrode 13.

When the bias voltage $V_1$ is constant, the capacitance value can be varied by applying a variable voltage pulse to the variable electrode 13. It will be understood that, when the bias voltage is changed from $V_1$ to $V_2$, the capacitance value can be changed as shown by $\Delta C_A$, $\Delta C_B$ and $\Delta C_C$.

Accordingly, employment of the embodiment according to the present invention enables the capacitance value to be varied by changing the bias voltage applied to the bias terminal. Since a voltage applied from an external circuit connected to the capacitance terminal is cut off by the bias cut-off capacitor, a constant and relatively low bias can be applied to the capacitance electrode. There is therefore no change in capacitance with time, which means that it is possible to obtain a semiconductor variable capacitance element of high reliability.

Although the present invention has been described in detail with reference to the circuit diagram, in an actual variable capacitance element the semiconductor variable capacitance element, the RF cut-off resistor and the bias cut-off capacitor can be formed on a single semiconductor substrate. It is also possible to form a semiconductor variable capacitance element having the above-described constituent elements and further fabricate a semiconductor variable capacitance element in a part of a semiconductor integrated circuit.

As will be clear from the above description, the semiconductor variable capacitance element according to the present invention is provided with a bias terminal which enables a bias voltage to be externally applied to the capacitance electrode, thereby allowing the capacitance value of the semiconductor variable capacitance element to be also varied in accordance with the bias voltage applied to the bias terminal. Since a voltage applied from an external circuit connected to the capacitance electrode is cut off by a bias cut-off capacitor, a constant and relatively low bias voltage can be applied to the capacitance electrode at all times. Since any bias voltage used in the external circuit is prevented from being unnecessarily applied to the capacitance electrode, it is possible to obtain a semiconductor variable capacitance element which is free from any change in capacitance with time and has high reliability.

I claim:

1. A semiconductor variable capacitance element comprising:
   a floating MOS variable capacitor comprised of a semiconductor substrate, a floating electrode, an insulator film, a capacitance electrode and a control electrode, the semiconductor substrate having a major surface and a capacitance region under the major surface, the floating electrode having opposed major surfaces and being disposed on the major surface of the semiconductor substrate for controlling the capacitance of the capacitive region, the insulator film covering the opposed major surfaces of the floating electrode to insulate the floating electrode from the outside, the capacitance electrode being capacitively strongly coupled to the floating electrode, and the control electrode being formed in the semiconductor substrate for injecting electric charge into the floating electrode;
   bias means for applying a bias voltage to the capacitance electrode; and
   a DC blocking capacitor connected to the capacitance electrode to cut out DC voltage of an external circuit and to connect the floating MOS variable capacitor to the external circuit.

2. A semiconductor variable capacitance element as claimed in claim 1; wherein the insulator film comprises an oxide film.

3. A semiconductor variable capacitance element as claimed in claim 1; including an RF cut-off element connected between the bias means and the capacitance electrode.

4. A semiconductor variable capacitance element as claimed in claim 1; wherein the capacitance electrode comprises a diffusion region formed under the major surface of the semiconductor substrate.

5. A semiconductor variable capacitance element as claimed in claim 2; including an RF cut-off element connected between the bias means and the capacitance electrode.

6. A semiconductor variable capacitance element as claimed in claim 3; wherein the RF cut-off element comprises a resistance element.

7. A semiconductor variable capacitance element as claimed in claim 5; wherein the RF cut-off element comprises a resistance element.

8. A variable capacitive element electrically connectable to an external circuit, comprising: a semiconductor substrate having a major surface and a capacitive region under the major surface of the semiconductor substrate; an insulating film disposed on the major surface of the semiconductor substrate; a floating electrode disposed on the insulating film and electrically insulated from the semiconductor substrate through the insulating film for storing electric charge to build up an electric potential in the floating electrode according to the stored amount of electric charge to thereby determine an amount of capacitance of the capacitive region; a control electrode formed in the semiconductor substrate for injecting electric charge into the floating electrode; a terminal electrode capacitively coupled to the floating electrode; bias means for applying a given voltage to the terminal electrode to change the electric potential of the floating electrode through the capacitive coupling between the terminal electrode and floating electrode; and blocking means electrically connected between the terminal electrode and the external circuit for blocking an application of a DC voltage from the external circuit to the terminal electrode.

9. A variable capacitive element as claimed in claim 8; wherein the blocking means comprises a capacitor.

10. A variable capacitive element as claimed in claim 8; wherein the capacitive region comprises a depletion region formed in the semiconductor substrate under the floating electrode.

11. A variable capacitive element as claimed in claim 10; wherein the terminal electrode comprises a diffusion region formed in the semiconductor substrate adjacent to the depletion region under the floating electrode so that the diffusion region is capacitively strongly coupled to the floating electrode through the insulating film.

12. A variable capacitive element as claimed in claim 8; including an RF cut element connected between the terminal electrode and the bias means for cutting out RF components of the voltage applied to the bias means.

13. A variable capacitive element as claimed in claim 12; wherein the RF cut element comprises a resistor.

* * * * *